(12) United States Patent
Katou et al.

(10) Patent No.: US 10,103,222 B2
(45) Date of Patent: Oct. 16, 2018

(54) SEMICONDUCTOR DEVICE

(71) Applicant: KABUSHIKI KAISHA TOSHIBA, Minato-ku, Tokyo (JP)

(72) Inventors: Hiroaki Katou, Ishikawa (JP); Syotaro Ono, Ishikawa (JP); Masahiro Shimura, Ishikawa (JP); Hideyuki Ura, Ishikawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/251,726

(22) Filed: Aug. 30, 2016

(65) Prior Publication Data

US 2017/0207302 A1    Jul. 20, 2017

(30) Foreign Application Priority Data

Jan. 15, 2016   (JP) ................................. 2016-006051

(51) Int. Cl.
*H01L 29/423*  (2006.01)
*H01L 29/06*  (2006.01)
*H01L 29/10*  (2006.01)
*H01L 29/49*  (2006.01)
*H01L 29/167*  (2006.01)
*H01L 29/739*  (2006.01)
*H01L 29/78*  (2006.01)

(52) U.S. Cl.
CPC ...... *H01L 29/0634* (2013.01); *H01L 29/1095* (2013.01); *H01L 29/167* (2013.01); *H01L 29/4916* (2013.01); *H01L 29/7396* (2013.01); *H01L 29/7802* (2013.01)

(58) Field of Classification Search
None
See application file for complete search history.

(56) References Cited

U.S. PATENT DOCUMENTS

| 6,153,896 A | 11/2000 | Omura et al. |
| 6,798,025 B2 | 9/2004 | Matsuda |
| 7,679,136 B2 | 3/2010 | Kachi et al. |
| 2010/0308399 A1* | 12/2010 | Saito .................. H01L 29/0634 257/329 |

(Continued)

FOREIGN PATENT DOCUMENTS

JP    2012-138593 A    7/2012

*Primary Examiner* — Ali Naraghi
(74) *Attorney, Agent, or Firm* — Foley & Lardner LLP

(57) ABSTRACT

A semiconductor device includes a first semiconductor region of a first conductivity type, a second semiconductor region of a second conductivity type provided on a part of the first semiconductor region, a third semiconductor region of the first conductivity type provided on a part of the second semiconductor region, a gate electrode, a first electrode, and a conductive portion. The gate electrode is provided on another part of the second semiconductor region via a gate insulating portion. The first electrode is provided on the third semiconductor region and electrically connected to the third semiconductor region. The conductive portion is provided on another part of the first semiconductor region via a first insulating portion and electrically connected to the first electrode, and includes a portion arranged side by side with the gate electrode in a second direction perpendicular to a first direction from the first semiconductor region to the first electrode.

19 Claims, 8 Drawing Sheets

(56) References Cited

U.S. PATENT DOCUMENTS

2014/0110779 A1\* 4/2014 Tamaki ............ H01L 29/66727
257/330
2015/0372103 A1\* 12/2015 Liang .................... H01L 29/402
257/139

\* cited by examiner

SEMICONDUCTOR DEVICE

CROSS-REFERENCE TO RELATED APPLICATION

This application claims the benefit of and priority to Japanese Patent Application No. 2016-006051, filed Jan. 15, 2016, the entire contents of which are incorporated herein by reference.

FIELD

Embodiments described herein relate generally to a semiconductor device.

BACKGROUND

In a semiconductor device, such as a metal oxide semiconductor field effect transistor (MOSFET), a surge voltage generated when the semiconductor device turns on may cause oscillation of the gate voltage. The occurrence of oscillation of the gate voltage causes the intensity of radio waves radiated from the semiconductor device to increase, and thus may cause a malfunction of another electronic device.

SUMMARY

In some embodiments according to one aspect, a semiconductor device may include a first semiconductor region of a first conductivity type, a second semiconductor region of a second conductivity type provided on a part of the first semiconductor region, a third semiconductor region of the first conductivity type provided on a part of the second semiconductor region, a gate electrode provided on another part of the second semiconductor region via a gate insulating portion, a first electrode provided on the third semiconductor region and electrically connected to the third semiconductor region, and a conductive portion provided on another part of the first semiconductor region via a first insulating portion. The conductive portion may include a portion arranged side by side with the gate electrode in a second direction perpendicular to a first direction from the first semiconductor region to the first electrode. The conductive portion may be electrically connected to the first electrode.

In some embodiments according to another aspect, a semiconductor device may include a substrate region of a first conductivity type, a base region of a second conductivity type provided on a part of the substrate region, a source region of the first conductivity type provided on a part of the base region, a gate electrode provided on another part of the base region via an insulating layer, a source electrode provided on the source region and electrically connected to the source region, and a conductive portion provided on another part of the substrate region via the insulating layer. The conductive portion may include a portion arranged side by side with the gate electrode. The conductive portion may be electrically connected to the source electrode.

Other aspects and embodiments of the disclosure are also encompassed. The foregoing summary and the following detailed description are not meant to restrict the disclosure to any particular embodiment but are merely meant to describe some embodiments of the disclosure.

DETAILED DESCRIPTION

Figure 1:
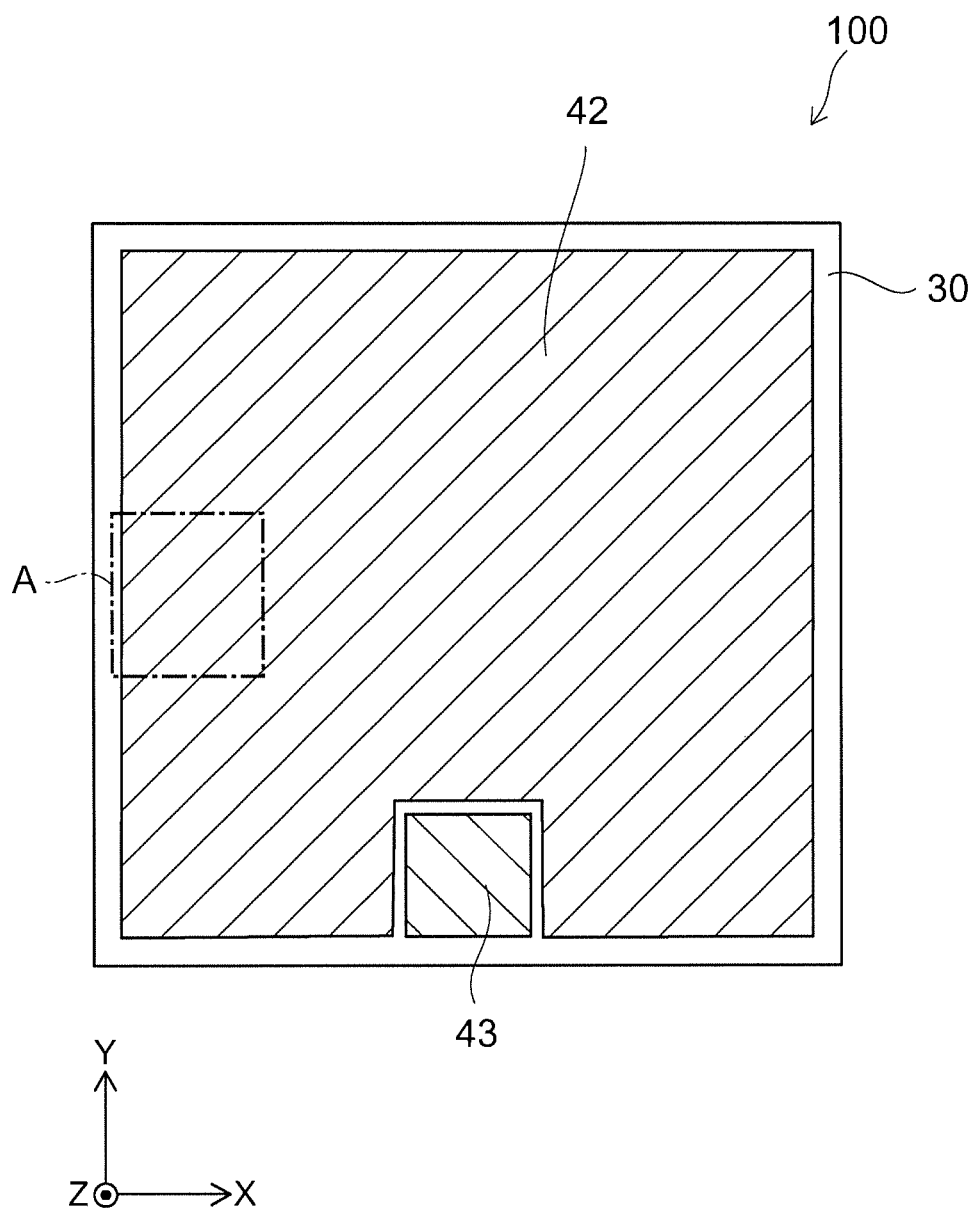
FIG. 1 is a plan view illustrating a semiconductor device according to some embodiments.

An object of some embodiments is to provide a semiconductor device capable of preventing oscillation of the gate voltage.

In general, according to some embodiments, a semiconductor device includes a first semiconductor region of a first conductivity type, a second semiconductor region of a second conductivity type, a third semiconductor region of the first conductivity type, a gate electrode, a first electrode, and a conductive portion.

The second semiconductor region is provided on a part of the first semiconductor region.

The third semiconductor region is provided on a part of the second semiconductor region.

The gate electrode is provided on another part of the second semiconductor region via a gate insulating portion.

The first electrode is provided on the third semiconductor region. The first electrode is electrically connected to the third semiconductor region.

The conductive portion is provided on another part of the first semiconductor region via a first insulating portion. The conductive portion includes a portion arranged side by side with the gate electrode in a second direction perpendicular to a first direction from the first semiconductor region to the first electrode. The conductive portion is electrically connected to the first electrode.

Hereinafter, embodiments will be described with reference to the drawings.

Furthermore, the drawings may be schematic or conceptual ones, and the relationship in thickness and width between various regions, sections, and portions, the ratio in size between various regions, sections, and portions, and other factors are not necessarily the same as the actual ones. Moreover, even when the same regions, sections, and portions are illustrated, the illustrated dimensions or ratios of the various regions, sections, and portions may vary with the drawings.

Additionally, in the present specification and drawings, elements similar to those already described are assigned the respective same reference characters, and the detailed description thereof may be omitted as appropriate.

In the description of some embodiments, an XYZ Cartesian coordinate system is used. For example, a direction from an $n^-$-type semiconductor region 1 to a source electrode 42 is referred to as a "Z-direction" (e.g., as a first direction). Two directions that are perpendicular to the Z-direction and are orthogonal to each other are referred to as an "X-direction" (e.g., as a third direction) and a "Y-direction" (e.g., as a second direction). By perpendicular or orthogonal, the terms can refer to precisely 90° as well as a range of variation of less than or equal to ±5° relative to 90°, such as less than or equal to ±4°, less than or equal to ±3°, less than or equal to ±2°, or less than or equal to +1°. In the description of some embodiments, an element provided "on" another element can encompass cases where the former element is directly on (e.g., in physical contact with) the latter element, as well as cases where one or more intervening elements are located between the former element and the latter element. In the description of some embodiments, an element provided "beneath" another element can encompass cases where the former element is directly beneath (e.g., in physical contact with) the latter element, as well as cases where one or more intervening elements are located between the former element and the latter element.

In the following description, symbols $n^+$, n, and $n^-$ represent relative highness or lowness of an impurity (or a dopant) concentration in a particular conductivity type (e.g., a first conductivity type). Similarly, symbols $p^+$, p, and $p^-$ represent relative highness or lowness of an impurity concentration in another conductivity type (e.g., a second conductivity type). More specifically, the symbol suffixed with "+" indicates that the impurity concentration is relatively higher than that in the symbol suffixed with neither of "+" and "−", and the symbol suffixed with "−" indicates that the impurity concentration is relatively lower than that in the symbol suffixed with neither of "+" and "−".

In each of the embodiments described below, each embodiment can be implemented with the p-type and n-type of semiconductor regions replaced with each other.

An example of a semiconductor device according to some embodiments is described with reference to FIG. 1 to FIG. 4.

FIG. 1 is a plan view illustrating a semiconductor device 100 according to some embodiments.

Figure 2:
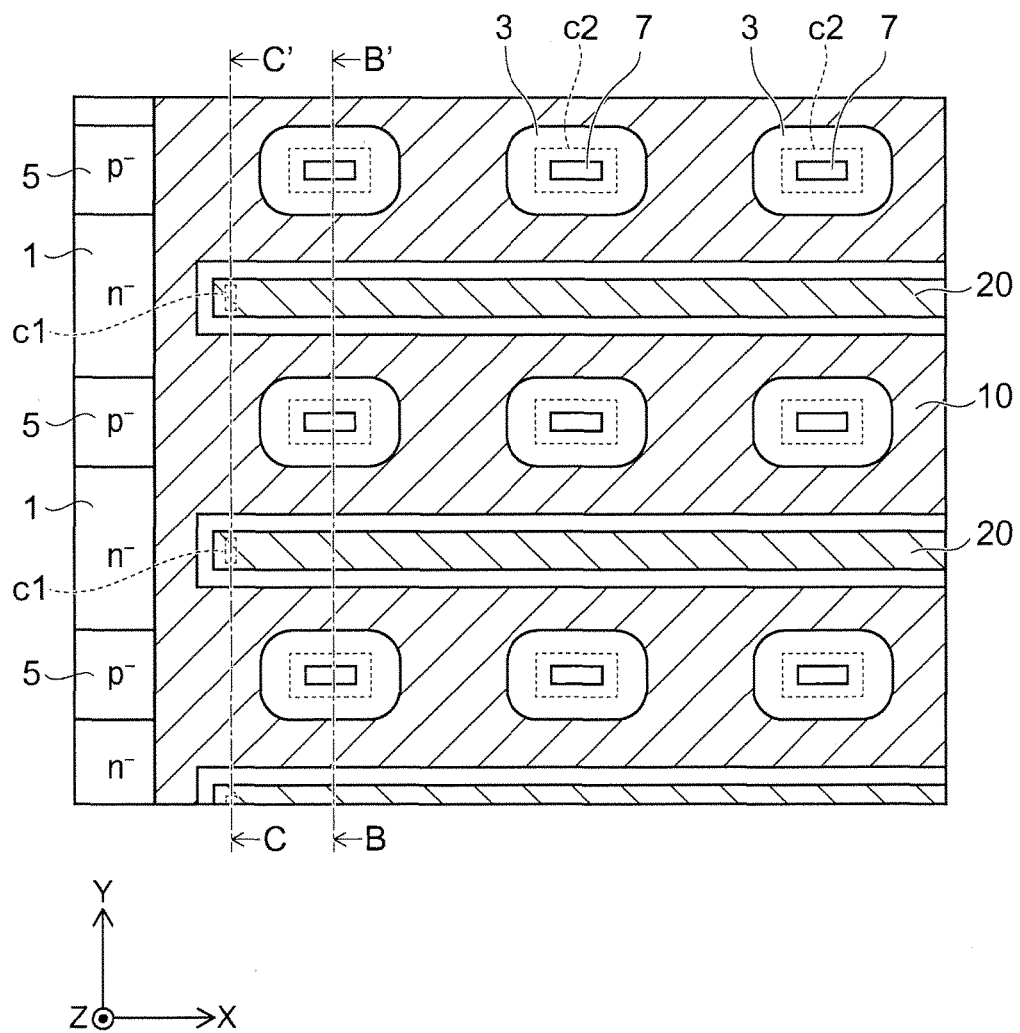
FIG. 2 is an enlarged plan view obtained by enlarging a portion A illustrated in FIG. 1.

FIG. 2 is an enlarged plan view obtained by enlarging a portion A illustrated in FIG. 1.

Figure 3:
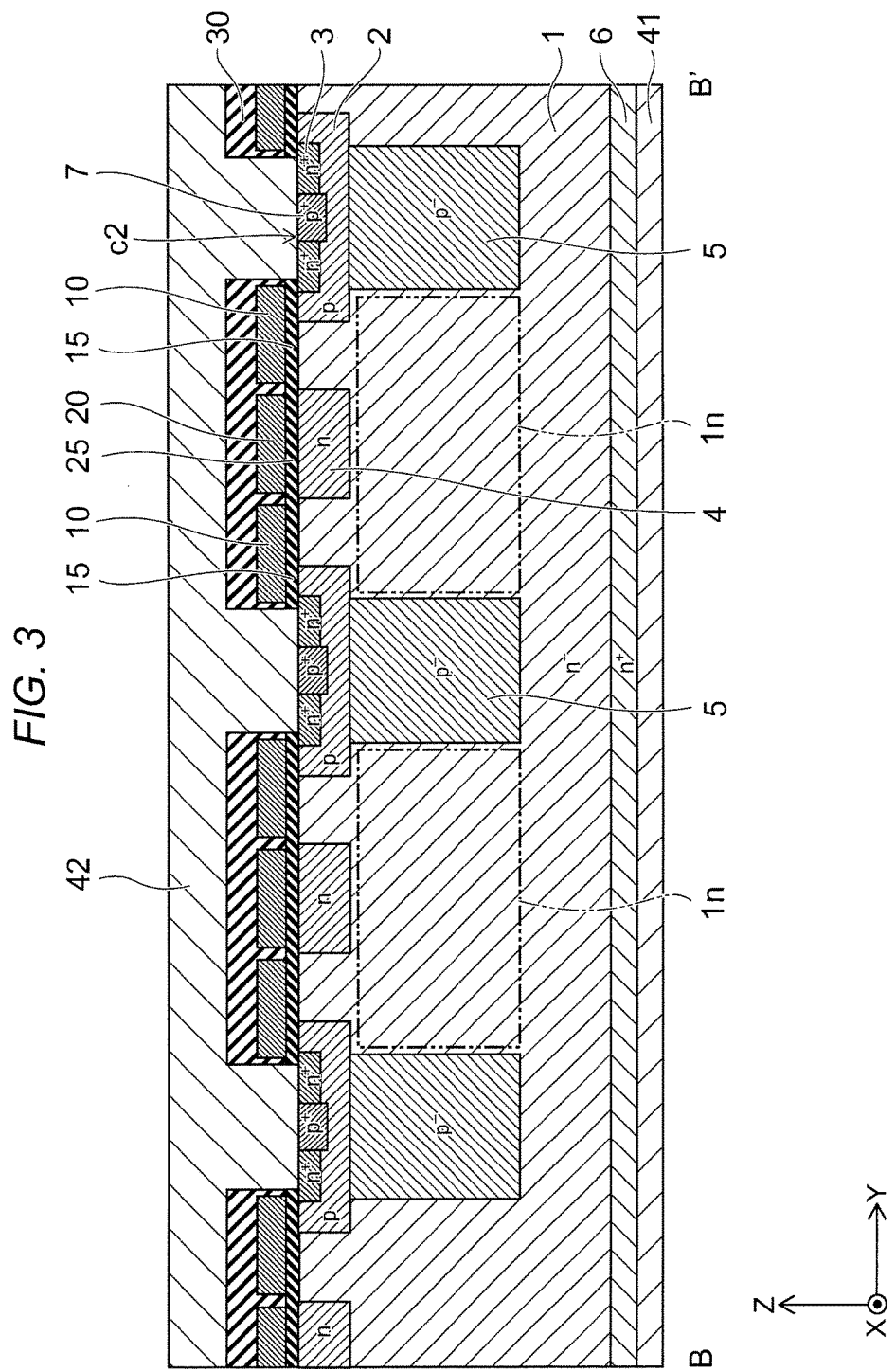
FIG. 3 is a cross-sectional view taken along line B-B' in FIG. 2.

FIG. 3 is a cross-sectional view taken along line B-B' in FIG. 2.

Figure 4:
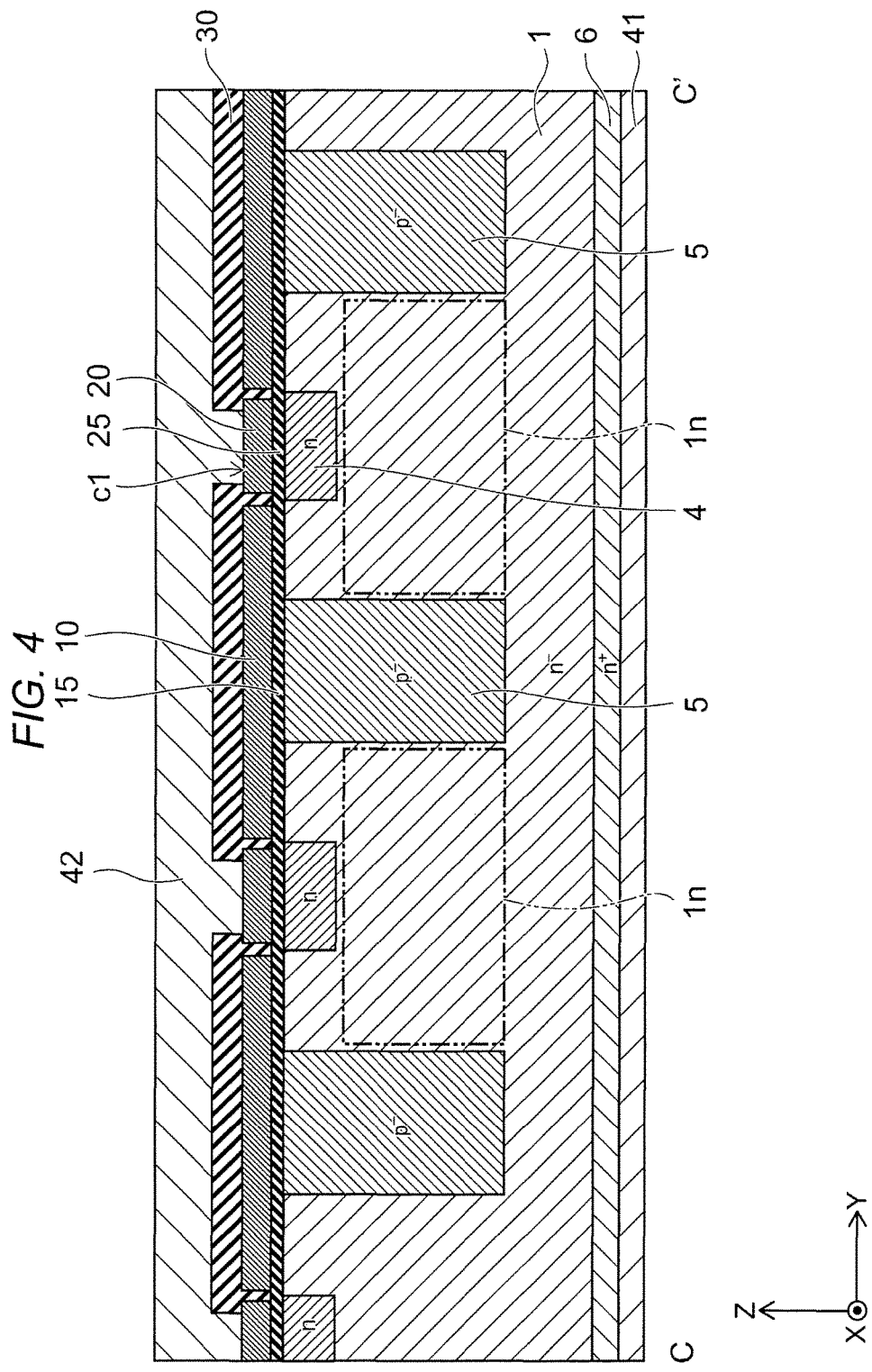
FIG. 4 is a cross-sectional view taken along line C-C' in FIG. 2.

FIG. 4 is a cross-sectional view taken along line C-C' in FIG. 2.

Moreover, in FIG. 2, an insulating layer 30, a source electrode 42, and a gate pad 43 are omitted from illustration.

The semiconductor device 100 is, for example, a MOSFET.

As illustrated in FIG. 1 to FIG. 4, in some embodiments, the semiconductor device 100 includes an $n^+$-type (e.g., as a first conductivity type) drain region 6, an $n^-$-type (e.g., as the first conductivity type) semiconductor region 1 (e.g., as a first semiconductor region or a substrate region), a $p^-$-type (e.g., as a second conductivity type) pillar region 5, a p-type (e.g., as the second conductivity type) base region 2 (e.g., as a second semiconductor region), an $n^+$-type source region 3 (e.g., as a third semiconductor region), a $p^+$-type (e.g., as the second conductivity type) contact region 7, an n-type (e.g., as the first conductivity type) semiconductor region 4 (e.g., as a fourth semiconductor region), a gate electrode 10, a gate insulating portion 15, a conductive portion 20, an insulating portion 25 (e.g., as a first insulating portion), an insulating layer 30, a drain electrode 41 (e.g., as a second electrode), a source electrode 42 (e.g., as a first electrode), and a gate pad 43.

As illustrated in FIG. 1, the source electrode 42 and the gate pad 43 are provided away from each other (e.g., electrically isolated from each other) as a part of the upper surface of the semiconductor device 100. The part other than the source electrode 42 and the gate pad 43 of the upper surface of the semiconductor device 100 is covered with the insulating layer 30.

As illustrated in FIG. 2, in some embodiments, the gate electrode 10 and the conductive portion 20 are provided away from each other (e.g., electrically isolated from each other) under the source electrode 42.

The conductive portion 20 extends in the X-direction and is surrounded by the gate electrode 10 along the X-Y plane. Furthermore, the conductive portion 20 is electrically connected to the source electrode 42 at a connection portion c1.

The gate electrode 10 is electrically connected to the gate pad 43. Furthermore, the gate electrode 10 has a plurality of apertures. Each of the $n^+$-type source region 3 and the $p^+$-type contact region 7 is connected via a part of a respective aperture (e.g., one of the plurality of apertures) to the source electrode 42 at a connection portion c2.

As illustrated in FIG. 3 and FIG. 4, in some embodiments, the drain electrode 41 is provided as a lower surface of the semiconductor device 100.

The $n^+$-type drain region 6 is provided on the drain electrode 41, and is electrically connected to the drain electrode 41.

The $n^-$-type semiconductor region 1 is provided on the $n^+$-type drain region 6.

In some embodiments, the $p^-$-type pillar region 5 is provided on a part of the $n^-$-type semiconductor region 1. The $n^-$-type semiconductor region 1 includes $n^-$-type pillar regions in arranged side by side with the $p^-$-type pillar regions 5 in the Y-direction. The $n^-$-type pillar regions $1n$ and the $p^-$-type pillar regions 5 are alternately arranged one by one in the Y-direction. Each of the $n^-$-type pillar regions $1n$ and the $p^-$-type pillar regions 5 extends in the X-direction. The $n^-$-type pillar regions in and the $p^-$-type pillar regions 5 constitute a super junction structure (hereinafter referred to as an "SJ structure").

In some embodiments, the p-type base region 2 is provided on the $p^-$-type pillar region 5. A plurality of p-type base regions 2 are provided in the X-direction and the Y-direction.

Each of the $n^+$-type source region 3 and the $p^+$-type contact region 7 is provided on a part of the p-type base region 2.

The gate electrode 10 is provided on the other part of the p-type base region 2 via the gate insulating portion 15. The gate electrode 10 faces a part of the $n^-$-type semiconductor region 1, a part of the p-type base region 2, and a part of the $n^+$-type source region 3 via the gate insulating portion 15.

In some embodiments, the n-type semiconductor region 4 is provided on the $n^-$-type pillar region in. The n-type semiconductor region 4 extends in the X-direction as with the conductive portion 20 and the $n^-$-type pillar region $1n$. Furthermore, the n-type semiconductor regions 4 are arranged side by side with at least part of the p-type base regions 2 in the Y-direction.

The conductive portion 20 is provided on the n-type semiconductor region 4 via the insulating portion 25. In some embodiments, the gate insulating portion 15 and the insulating portion 25 may be different parts of an insulating layer; for example, the gate insulating portion 15 and the insulating portion 25 may be integrally formed with one another, without an interface or boundary between the portions 15 and 25.

In some embodiments, the source electrode 42 is located on the $n^+$-type source region 3, the $p^+$-type contact region 7, and the conductive portion 20. The source electrode 42 is electrically connected to each of the n⁺-type source region 3, the p⁺-type contact region 7, and the conductive portion 20. The insulating layer 30 is provided between the source electrode 42 and the gate electrode 10, which are thus electrically separated from each other.

Here, examples of materials of the respective constituent elements are described.

In some embodiments, the n⁻-type semiconductor region 1, the p-type base region 2, the n⁺-type source region 3, the n-type semiconductor region 4, the p⁻-type pillar region 5, the n⁺-type drain region 6, and the p⁺-type contact region 7 may each include at least one of silicon, silicon carbide, gallium nitride, or gallium arsenide as a semiconductor material. These regions may include the same semiconductor material, or two or more of these regions may include different semiconductor materials.

In a case where silicon is used as a semiconductor material, arsenic, phosphorus, or antimony can be used as an n-type impurity. Boron can be used as a p-type impurity.

The gate electrode 10 and the conductive portion may each include a conductive material such as polycrystalline silicon (or polysilicon). The gate electrode 10 and the conductive portion 20 may include the same conductive material, or may include different conductive materials.

The gate insulating portion 15, the insulating portion 25, and the insulating layer 30 may each include an insulating material such as silicon oxide. The gate insulating portion 15, the insulating portion 25, and the insulating layer 30 may include the same insulating material, or may include different insulating materials.

The drain electrode 41, the source electrode 42, and the gate pad 43 may each include a metal such as aluminum. The drain electrode 41, the source electrode 42, and the gate pad 43 may include the same metal, or may include different metals.

In some embodiments, the gate electrode 10 and the conductive portion 20 can contain an n-type impurity or a p-type impurity. Adding an impurity to the gate electrode 10 and the conductive portion 20 can allow adjusting their conductive properties. As an example, the impurity concentration in the conductive portion 20 may be lower than the impurity concentration in the gate electrode 10.

Next, an example of a process for manufacturing the semiconductor device 100 according to some embodiments is described with reference to FIG. 5A, FIG. 5B, FIG. 6A and FIG. 6B.

FIG. 5A, FIG. 5B, FIG. 6A and FIG. 6B are process cross-sectional views illustrating a manufacturing process for the semiconductor device 100 according to some embodiments.

In each of FIG. 5A, FIG. 5B, FIG. 6A and FIG. 6B, the left-hand figure is a process cross-sectional view at a part of a position indicated by line B-B' in FIG. 2, and the right-hand figure is a process cross-sectional view at apart of a position indicated by line C-C' in FIG. 2.

Figure 5A:
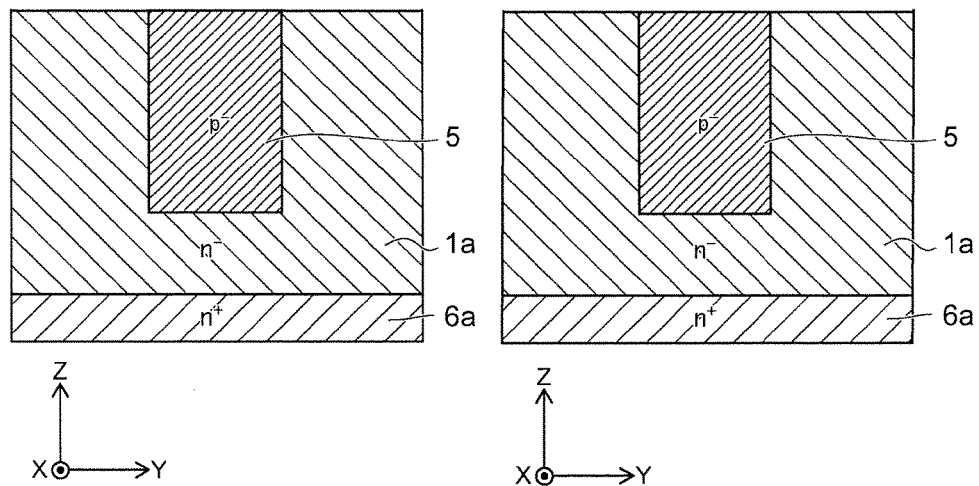
FIG. 5A and FIG. 5B are process cross-sectional views illustrating a manufacturing process for the semiconductor device according to some embodiments.

First, in some embodiments, the manufacturing process includes preparing a semiconductor substrate in which an n⁻-type semiconductor layer 1a is provided on an n⁺-type semiconductor layer 6a. Next, a plurality of apertures extending in the X-direction is formed on the surface of the n⁻-type semiconductor layer 1a. Then, these apertures are filled by epitaxially growing a semiconductor layer containing p-type impurities. With this, the p⁻-type pillar region 5 is formed in the n⁻-type semiconductor layer 1a as illustrated in FIG. 5A.

Figure 5B:
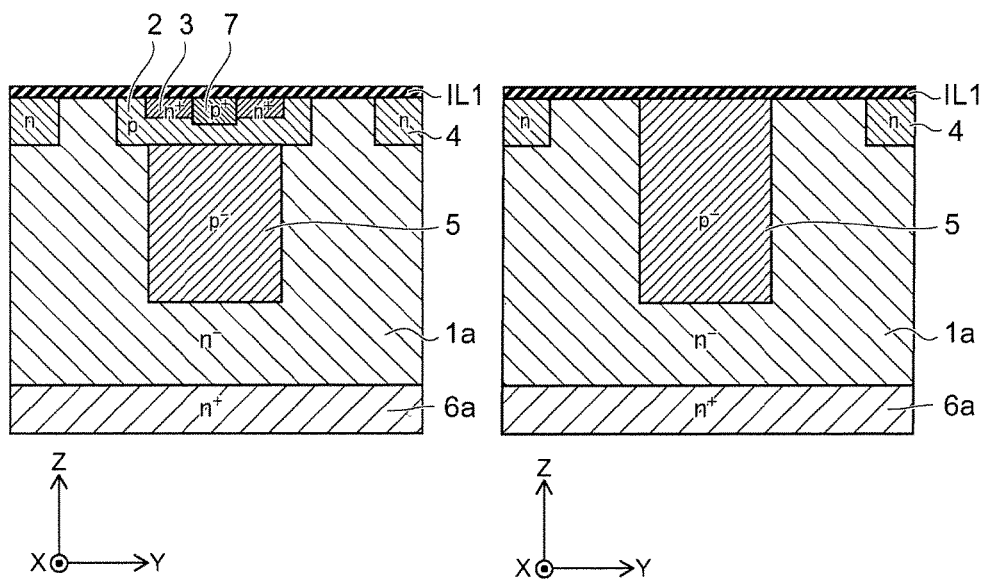

Next, in some embodiments, an n-type impurity is ion-implanted into a part of the surface of the n⁻-type semiconductor layer 1a, and a p-type impurity is ion-implanted into a part of the surface of the p⁺-type pillar region 5. The n-type and p-type impurities are activated by heat treatment to form the p-type base region 2 and the n-type semiconductor region 4. At this time, simultaneously, the semiconductor substrate may be thermally oxidized to form an insulating layer IL1 on the surface's of the n⁻-type semiconductor layer 1a, the p-type base region 2, and the n-type semiconductor region 4. Then, and sequentially, an n-type impurity and a p-type impurity are selectively ion-implanted into the surface of the p-type base region 2, and these impurities are activated to form the n⁺-type source region 3 and the p⁺-type contact region 7. The state obtained at this time is illustrated in FIG. 5B.

Figure 6A:
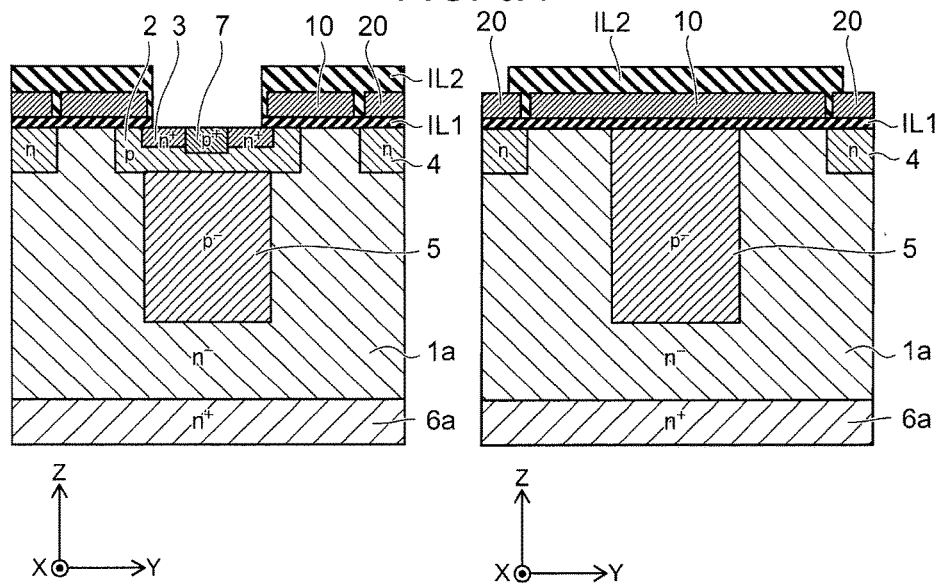
FIG. 6A and FIG. 6B are process cross-sectional views illustrating the manufacturing process for the semiconductor device according to some embodiments.

Next, in some embodiments, the manufacturing process includes forming a conductive layer containing, for example, polycrystalline silicon on the insulating layer IL1. Patterning is performed on the conductive layer to form the gate electrode 10 and the conductive portion 20. Then, an insulating layer IL2 covering the gate electrode 10 and the conductive portion 20 is formed. The manufacturing process includes forming apertures in the insulating layer IL2 to cause the n⁺-type source region 3, the p⁺-type contact region 7, and the conductive portion 20 to be exposed as illustrated in FIG. 6A.

Figure 6B:
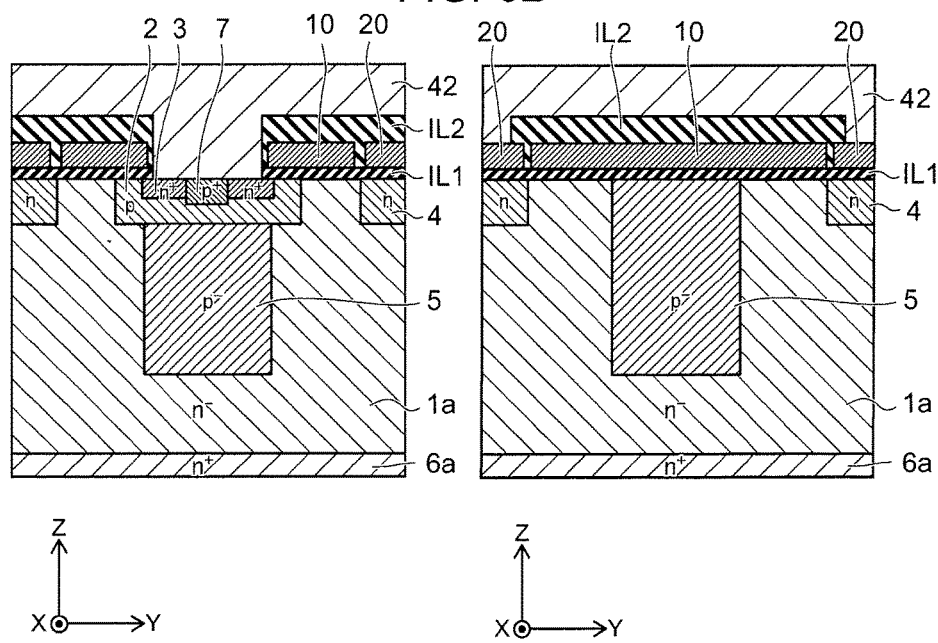

Next, in some embodiments, the manufacturing process includes forming a metal layer covering the insulating layer IL2. Patterning is performed on the metal layer to form the source electrode 42 and the gate pad 43, which is not illustrated in FIG. 6B. Then, the back surface of the n⁺-type semiconductor layer 6a is ground until the thickness of the n⁺-type semiconductor layer 6a reaches a predetermined thickness as illustrated in FIG. 6B.

After that, the drain electrode 41 is formed beneath the ground n⁺-type semiconductor layer 6a, so that the semiconductor device 100 illustrated in FIG. 1 to FIG. 4 is attained.

Here, functions and advantageous effects obtained by some embodiments are described.

In some embodiments, in the semiconductor device 100, when a voltage higher than or equal to a threshold value is applied to the gate electrode 10 and a positive voltage is applied to the drain electrode 41 with respect to the source electrode 42, the semiconductor device 100 enters an on-state, so that a current flows from the drain electrode 41 to the source electrode 42. After that, when the voltage applied to the gate electrode 10 becomes lower than the threshold value, the semiconductor device 100 enters an off-state. At this time, a surge voltage may be applied to the drain electrode 41 according to a change in value of a current flowing through the semiconductor device 100 and an inductance component in a circuit to which the semiconductor device 100 may be connected. When the surge voltage is applied to the drain electrode 41, a current may flow from the drain electrode 41 toward the source electrode 42 and the gate electrode 10. At this time, the current flowing from the drain electrode 41 to the gate electrode 10 may cause oscillation of the gate voltage. When the oscillation of the gate voltage occurs, the intensity of radio waves radiated from the semiconductor device 100, or an electrical circuit to which the semiconductor device 100 is connected, may become higher.

To cope with this issue, in some embodiments, the conductive portion 20 is provided in the semiconductor device 100. The conductive portion 20 faces the n-type semiconductor region 4 via the insulating portion 25, and thus constitutes a MOS capacitor. Furthermore, the conductive portion 20 is electrically connected to the source electrode 42. Such a structure corresponds to a resistance and a capacitance being inserted between the drain electrode 41 and the source electrode 42 on an electrical circuit of the semiconductor device 100. In other words, providing the conductive portion 20 can function as an RC (Resistor-Capacitor) snubber circuit being formed between the drain electrode 41 and the source electrode 42.

In a case where the conductive portion 20 is provided, when a surge voltage occurs in the drain electrode 41, since a part of a current also flows to the conductive portion 20 through the insulating portion 25, a current flowing to the gate electrode 10 may be restricted, so that the oscillation of the gate voltage can be prevented or reduced.

Furthermore, while a current having flowed through the conductive portion 20 flows to the source electrode 42, a capacitance is constituted by the n-type semiconductor region 4, the insulating portion 25, and the conductive portion 20. Accordingly, even when, due to the occurrence of a surge voltage, a current flows from the drain electrode 41 to the source electrode 42 via the conductive portion 20, an instantaneous variation in voltage can be reduced by the capacitance. Therefore, any increase in oscillation of a voltage between the source electrode 42 and the drain electrode 41 can be prevented or reduced.

Thus, according to some embodiments, any increase in oscillation of the drain voltage due to the surge voltage can be prevented or reduced, and, at the same time, the oscillation of the gate voltage can also be prevented or reduced.

Furthermore, while, in the example illustrated in FIG. 3 and FIG. 4, the n-type semiconductor region 4 is provided under the conductive portion 20, other embodiments are not limited to this example. For example, without the n-type semiconductor region 4 being provided, the conductive portion 20 can be located to directly face the n⁻-type semiconductor region 1 via the insulating portion 25. Even in this case, since a MOS capacitor is constituted by the n⁻-type semiconductor region 1, the insulating portion 25, and the conductive portion 20, any increase in oscillation of the drain voltage and the oscillation of the gate voltage can be prevented or reduced.

However, since the n-type semiconductor region 4 is less likely to be formed into a depletion region than the n⁻-type semiconductor region 1, providing the n-type semiconductor region 4 can improve the capacity of the MOS capacitor. Accordingly, in a case where the n-type semiconductor region 4 is provided, the oscillation of the drain voltage and the oscillation of the gate voltage can be further prevented or reduced than in a case where the n-type semiconductor region 4 is not provided.

Moreover, in a case where the gate electrode 10 and the conductive portion 20 contain n-type impurities or p-type impurities, the impurity concentration in the conductive portion 20 may be lower than the impurity concentration in the gate electrode 10. Reducing the impurity concentration in the conductive portion 20 can increase the electrical resistance of the conductive portion 20. Increasing the electrical resistance of the conductive portion 20 can reduce the magnitude of a current flowing from the drain electrode 41 to the source electrode 42 via the conductive portion 20 due to the surge voltage. Therefore, any increase in oscillation of the drain voltage can be further prevented or reduced.

Some embodiments can also be applied to a case where the semiconductor device 100 does not have the SJ structure. However, the oscillation of the gate voltage may tend to become larger as a breakdown voltage for the semiconductor device 100 becomes higher. Usually, since the SJ structure is used for semiconductor devices having high breakdown voltages, some embodiments can be advantageously used for semiconductor devices having the SJ structure.

Figure 7A:
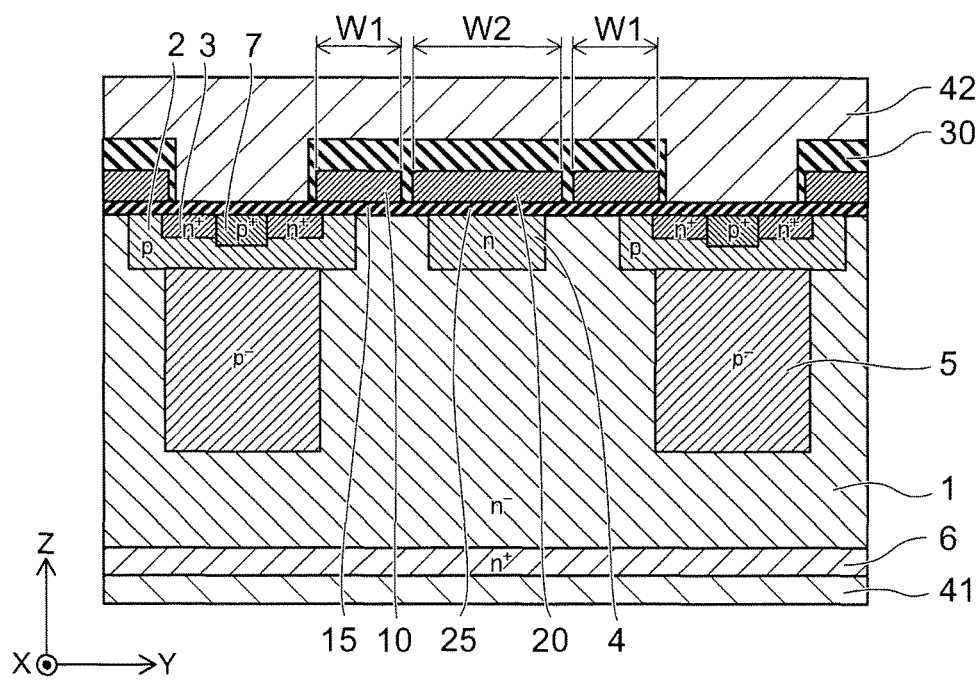
FIG. 7A and FIG. 7B are cross-sectional views illustrating a part of the semiconductor device according to some embodiments.
Figure 7B:
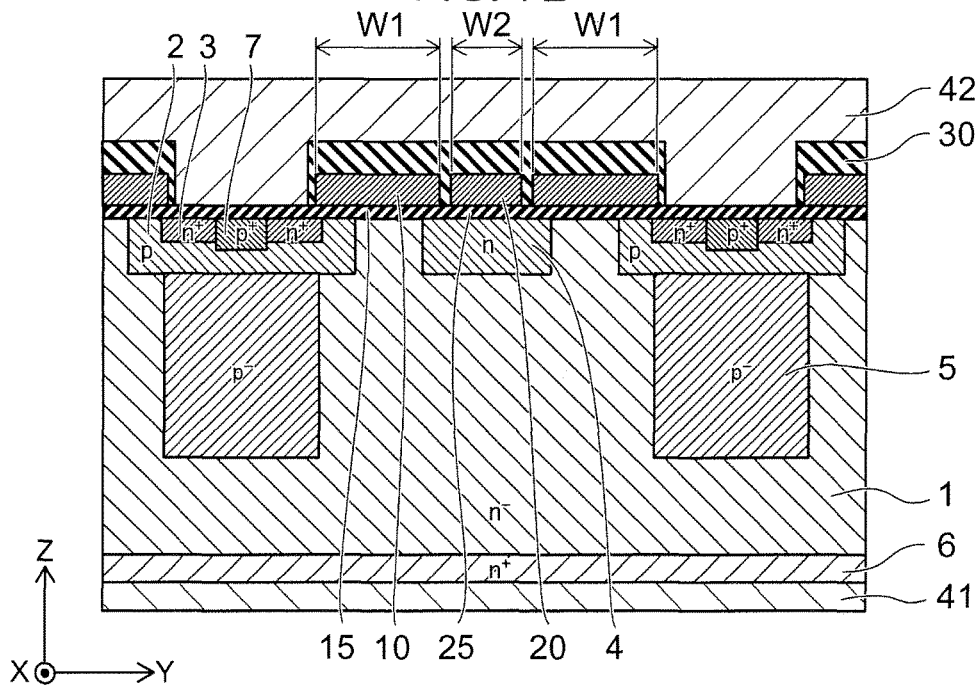

Furthermore, as illustrated in FIG. 7A and FIG. 7B, the lengths of portions of each of the gate electrode 10 and the conductive portion 20 can be changed as appropriate.

FIG. 7A and FIG. 7B are cross-sectional views illustrating apart of the semiconductor device 100 according to some embodiments.

For example, as illustrated in FIG. 7A, the width W2 of the conductive portion 20 can be wider than the width W1 of the gate electrode 10. For example, W2 can be at least 1.05×W1 or at least 1.1×W1. Making the width W2 of the conductive portion 20 wider than the width W1 of the gate electrode 10 can increase the capacitance in the RC snubber circuit and thus further preventing or reducing the oscillation of the gate voltage.

Moreover, here, the width W1 of the gate electrode 10 refers to the length in the Y-direction of a portion located between the conductive portion 20 and the source electrode 42 in the Y-direction of the gate electrode 10. Additionally, the width W2 of the conductive portion 20 refers to the length in the Y-direction of a portion arranged side by side with the gate electrode 10 in the Y-direction of the conductive portion 20.

Alternatively, as illustrated in FIG. 7B, the width W1 of the gate electrode 10 can be wider than the width W2 of the conductive portion 20. For example, W1 can be at least 1.05×W2 or at least 1.1×W2. Making the width W1 of the gate electrode 10 wider than the width W2 of the conductive portion 20 can increase the gate-to-drain capacitance and thus adjusting the switching speed of the semiconductor device 100.

In this instance, a part of the gate electrode 10 can be located to face a part of the n-type semiconductor region 4 via the insulating portion 25. The gate electrode 10 and the n-type semiconductor region 4 facing each other via the insulating portion 25 can further improve the gate-to-drain capacitance.

Modification Example

Next, a modified semiconductor device according to some embodiments is described with reference to FIG. 8.

Figure 8:
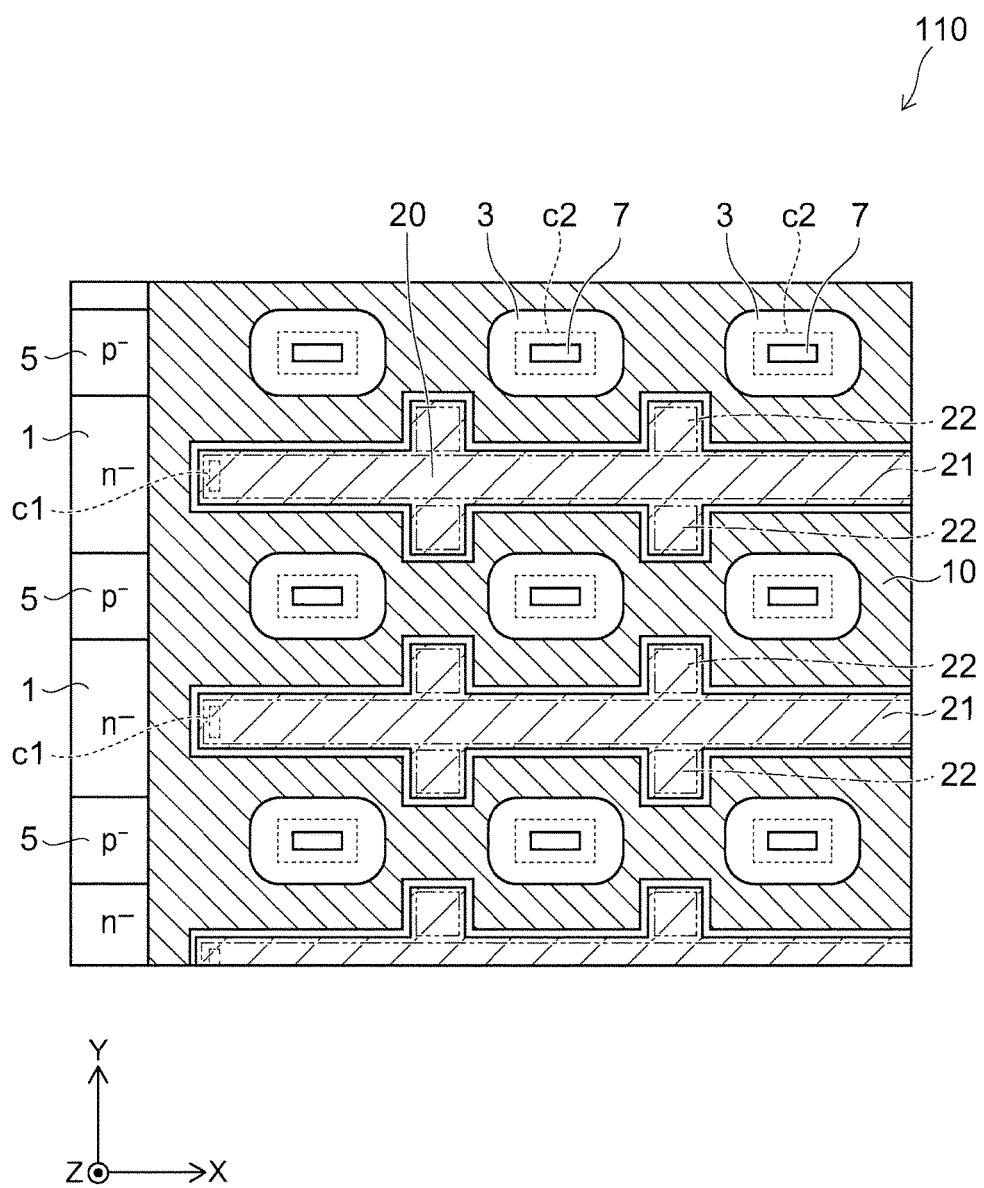
FIG. 8 is an enlarged plan view obtained by enlarging a part of a semiconductor device according to some embodiments.

FIG. 8 is an enlarged plan view obtained by enlarging apart of a semiconductor device 110 as a modification example according to some embodiments.

In some embodiments, the semiconductor device 110 as a modification example differs in the structure of the conductive portion 20 from the semiconductor device 100 (see FIG. 1 and FIG. 2). As illustrated in FIG. 8, the conductive portion 20 includes a first conductive portion 21 and a second conductive portion 22. The first conductive portion 21 extends in the X-direction, and the second conductive portion 22 protrudes from the first conductive portion 21 in both the Y-direction and the −Y-direction.

The conductive portion 20 including the second conductive portion 22 can increase an area at which the conductive portion 20 and semiconductor regions located under the conductive portion 20 face each other. Therefore, the capacitance of the RC snubber circuit can be made larger than in the semiconductor device 100. In other words, in the semiconductor device 110 according to some embodiments, any increase in oscillation of the drain voltage can be further prevented or reduced than in the semiconductor device 100 (see FIG. 1 and FIG. 2).

Furthermore, in the above-described examples, a case has been described in which embodiments are applied to a MOSFET. However, the above-described embodiments can be applied beyond a MOSFET and also, for example, an insulated gate bipolar transistor (IGBT). In a case where embodiments are applied to the IGBT, for example, in the example illustrated in FIG. 3 and FIG. 4, a $p^+$-type semiconductor region electrically connected to the drain electrode 41 may be provided between the drain electrode 41 and the drain region 6.

In the above-described embodiments, the relative highness or lowness of the impurity concentration between the respective semiconductor regions can be checked using, for example, a scanning capacitance microscope (SCM). Additionally, in some embodiments, the carrier concentration in each semiconductor region can be deemed to be equal to the concentration of impurities activated in each semiconductor region. Accordingly, the relative highness or lowness of the carrier concentration between the semiconductor regions can also be checked using the SCM.

Furthermore, the impurity concentration in each semiconductor region can be measured by, for example, secondary ion mass spectrometry (SIMS).

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. Specific structures of various elements included in the embodiments, such as the $n^+$-type drain region 6, the $n^-$-type semiconductor region 1, the p-type base region 2, the $n^+$-type source region 3, the n-type semiconductor region 4, the $p^-$-type pillar region 5, the $p^+$-type contact region 7, the gate electrode 10, the gate insulating portion 15, the insulating layer 30, the drain electrode 41, the source electrode 42, and the gate pad 43, can be selected as appropriate by a person skilled in the art. The accompanying claims and their equivalents are intended to cover such forms or modifications as would fall within the scope and spirit of the present disclosure. Moreover, some or all of the above-described embodiments can be combined when implemented.

What is claimed is:

1. A semiconductor device comprising:
   a first semiconductor region of a first conductivity type;
   a second semiconductor region of a second conductivity type provided on a part of the first semiconductor region;
   a third semiconductor region of the first conductivity type provided on a part of the second semiconductor region;
   a gate insulating portion;
   a gate electrode provided on another part of the second semiconductor region via the gate insulating portion;
   a first electrode provided on the third semiconductor region and electrically connected to the third semiconductor region;
   a first insulating portion;
   a conductive portion provided on another part of the first semiconductor region via the first insulating portion, the conductive portion including a portion arranged side by side with the gate electrode in a second direction perpendicular to a first direction from the first semiconductor region to the first electrode, and electrically connected to the first electrode; and
   a fourth semiconductor region of the first conductivity type provided directly under the first insulating portion.

2. The semiconductor device according to claim 1, wherein the fourth semiconductor region is provided on the another part of the first semiconductor region, and
   wherein the conductive portion is provided on the fourth semiconductor region via the first insulating portion.

3. The semiconductor device according to claim 2, wherein the fourth semiconductor region is arranged side by side with at least a part of the second semiconductor region in the second direction.

4. The semiconductor device according to claim 1, wherein the conductive portion includes a first portion extending in a third direction perpendicular to the first direction and the second direction, and is surrounded by the gate electrode.

5. The semiconductor device according to claim 4, wherein the conductive portion further includes a second portion protruding from the first portion in the second direction.

6. The semiconductor device according to claim 1, wherein the gate electrode and the conductive portion include polycrystalline silicon.

7. The semiconductor device according to claim 6, wherein the gate electrode and the conductive portion include an impurity of the first conductivity type or the second conductivity type, and
   a concentration of the impurity in the conductive portion is lower than a concentration of the impurity in the gate electrode.

8. The semiconductor device according to claim 1, further comprising a second electrode provided beneath the first semiconductor region.

9. A semiconductor device comprising:
   a first semiconductor region of a first conductivity type;
   a second semiconductor region of a second conductivity type provided on a part of the first semiconductor region;
   a third semiconductor region of the first conductivity type provided on a part of the second semiconductor region;
   a gate insulating portion;
   a gate electrode provided on another part of the second semiconductor region via the gate insulating portion;
   a first electrode provided on the third semiconductor region and electrically connected to the third semiconductor region;
   a first insulating portion;
   a conductive portion provided on another part of the first semiconductor region via the first insulating portion, the conductive portion including a portion arranged side by side with the gate electrode in a second direction perpendicular to a first direction from the first semiconductor region to the first electrode, and electrically connected to the first electrode; and
   a fourth semiconductor region of the first conductivity type provided on the another part of the first semiconductor region,
   wherein the conductive portion is provided on the fourth semiconductor region via the first insulating portion, and
   wherein the fourth semiconductor region is arranged side by side with at least a part of the second semiconductor region in the second direction.

10. The semiconductor device according to claim 9, wherein the conductive portion includes a first portion extending in a third direction perpendicular to the first direction and the second direction, and is surrounded by the gate electrode.

11. The semiconductor device according to claim 10, wherein the conductive portion further includes a second portion protruding from the first portion in the second direction.

12. The semiconductor device according to claim 9, wherein the gate electrode and the conductive portion include polycrystalline silicon.

13. The semiconductor device according to claim 12, wherein the gate electrode and the conductive portion include an impurity of the first conductivity type or the second conductivity type, and
 a concentration of the impurity in the conductive portion is lower than a concentration of the impurity in the gate electrode.

14. The semiconductor device according to claim 9, further comprising a second electrode provided beneath the first semiconductor region.

15. A semiconductor device comprising:
 a first semiconductor region of a first conductivity type;
 a second semiconductor region of a second conductivity type provided on a part of the first semiconductor region;
 a third semiconductor region of the first conductivity type provided on a part of the second semiconductor region;
 a gate insulating portion;
 a gate electrode provided on another part of the second semiconductor region via the gate insulating portion;
 a first electrode provided on the third semiconductor region and electrically connected to the third semiconductor region;
 a first insulating portion; and
 a conductive portion provided on another part of the first semiconductor region via the first insulating portion, the conductive portion including a first portion arranged side by side with the gate electrode in a second direction perpendicular to a first direction from the first semiconductor region to the first electrode, and electrically connected to the first electrode,
 wherein the conductive portion includes a second portion surrounded by the gate electrode and extending in a third direction perpendicular to the first direction and the second direction, and further includes a third portion protruding from the second portion in the second direction.

16. The semiconductor device according to claim 15, further comprising a fourth semiconductor region of the first conductivity type provided on the another part of the first semiconductor region,
 wherein the conductive portion is provided on the fourth semiconductor region via the first insulating portion.

17. The semiconductor device according to claim 16, wherein the gate electrode and the conductive portion include an impurity of the first conductivity type or the second conductivity type, and
 a concentration of the impurity in the conductive portion is lower than a concentration of the impurity in the gate electrode.

18. The semiconductor device according to claim 15, wherein the gate electrode and the conductive portion include polycrystalline silicon.

19. The semiconductor device according to claim 15, further comprising a second electrode provided beneath the first semiconductor region.

* * * * *